United States Patent
Yeo et al.

(10) Patent No.: US 7,892,963 B2
(45) Date of Patent: Feb. 22, 2011

(54) INTEGRATED CIRCUIT PACKAGING SYSTEM AND METHOD OF MANUFACTURE THEREOF

(75) Inventors: Alfred Yeo, Singapore (SG); Kai Chong Chan, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 126 days.

(21) Appl. No.: 12/429,916

(22) Filed: Apr. 24, 2009

(65) Prior Publication Data

US 2010/0270670 A1  Oct. 28, 2010

(51) Int. Cl.
*H01L 21/4763* (2006.01)
*H01L 23/12* (2006.01)
*H01L 23/053* (2006.01)

(52) U.S. Cl. .................. 438/622; 257/700; 257/E23.01; 257/E23.021; 257/E23.019; 257/E23.02; 257/E23.022; 257/E25.01; 257/E25.011; 257/E25.012; 257/E25.013

(58) Field of Classification Search ......... 438/106–132, 438/597–688; 257/678–722, E23.01, E23.011, 257/E23.019–E23.022, E25.01–E25.017
See application file for complete search history.

(56) References Cited

U.S. PATENT DOCUMENTS

| | | | |
|---|---|---|---|
| 6,352,923 B1 * | 3/2002 | Hsuan et al. | 438/667 |
| 6,800,930 B2 | 10/2004 | Jackson et al. | |
| 6,908,856 B2 * | 6/2005 | Beyne et al. | 438/667 |
| 7,410,884 B2 | 8/2008 | Ramanathan et al. | |
| 2006/0001174 A1 * | 1/2006 | Matsui | 257/774 |
| 2007/0222050 A1 | 9/2007 | Lee et al. | |
| 2008/0079121 A1 | 4/2008 | Han | |
| 2008/0113505 A1 | 5/2008 | Sparks et al. | |

* cited by examiner

*Primary Examiner*—Michael S Lebentritt
*Assistant Examiner*—Karen M Kusumakar
(74) *Attorney, Agent, or Firm*—Mikio Ishimaru

(57) ABSTRACT

A method of manufacture of an integrated circuit packaging system includes: providing an integrated circuit substrate having a non-active side and an active side; forming a recess in the integrated circuit substrate from the non-active side exposing a first contact and a second contact with the first contact and the second contact along the active side; forming a first via, having a first via extension extended beyond the non-active side and an opening at the non-active side, within the recess; forming a barrier liner within the opening with the barrier liner exposed beyond the non-active side; and forming a second via over the barrier liner and within the opening of the first via with the second via exposed beyond the non-active side.

20 Claims, 7 Drawing Sheets

INTEGRATED CIRCUIT PACKAGING SYSTEM AND METHOD OF MANUFACTURE THEREOF

TECHNICAL FIELD

The present invention relates generally to an integrated circuit packaging system, and more particularly to a system for an integrated circuit packaging system with a through-via.

BACKGROUND ART

Increased miniaturization of components, greater packaging density of integrated circuits ("ICs"), higher performance, and lower cost are ongoing goals of the computer and communication industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit packaging system providing low cost manufacturing, improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an integrated circuit substrate having a non-active side and an active side; forming a recess in the integrated circuit substrate from the non-active side exposing a first contact and a second contact with the first contact and the second contact along the active side; forming a first via, having a first via extension extended beyond the non-active side and an opening at the non-active side, within the recess; forming a barrier liner within the opening with the barrier liner exposed beyond the non-active side; and forming a second via over the barrier liner and within the opening of the first via with the second via exposed beyond the non-active side.

The present invention provides an integrated circuit packaging system, including: an integrated circuit substrate having a non-active side, an active side and a recess from the non-active side; a first contact along the active side and within the recess; a second contact along the active side and within the recess; a first via, having a first via extension extended beyond the non-active side and an opening at the non-active side, within the recess; a barrier liner within the opening with the barrier liner exposed beyond the non-active side; and a second via over the barrier liner and within the opening of the first via with the second via exposed beyond the non-active side.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
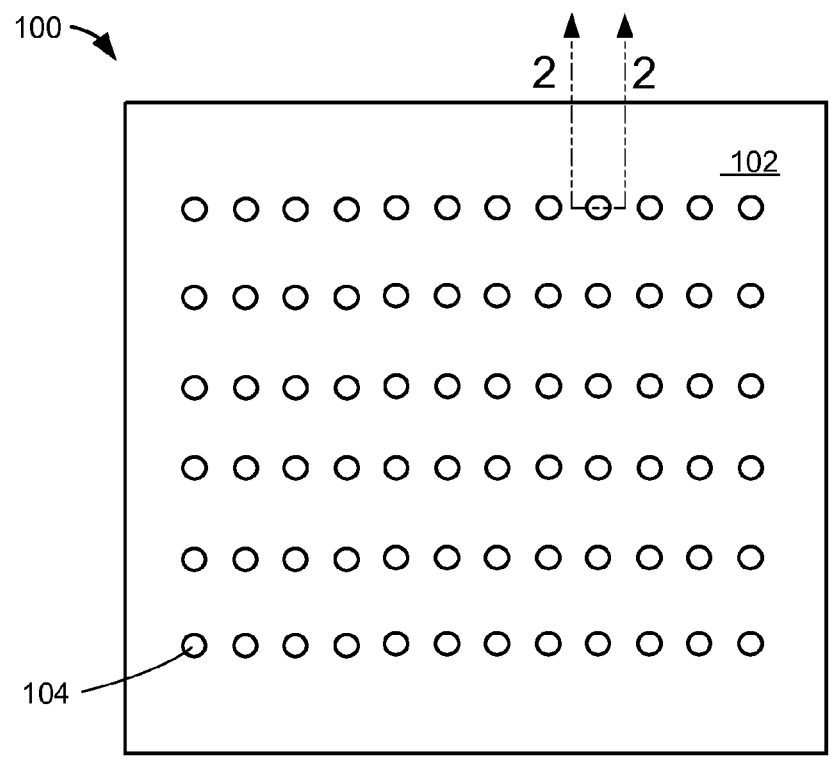
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an encapsulation 102, such as a post passivation protective layer or a cover including epoxy molding compound. Mounting pads 104, such as bond pads or under ball metallization (UBM), can be exposed from the encapsulation 102.

For example, the integrated circuit packaging system 100 is shown as an integrated circuit die, although it is understood that the integrated circuit packaging system 100 can be packaged within other encapsulating structure (not shown). Also for illustrative purposes, the integrated circuit packaging system 100 is shown with an array of the mounting pads 104, although it is understood that the integrated circuit packaging system 100 can have a different configuration for the mounting pads 104. For example, the integrated circuit packaging system 100 can have the mounting pads 104 in a peripheral configuration or an array configuration not uniformly distributed.

Figure 2:
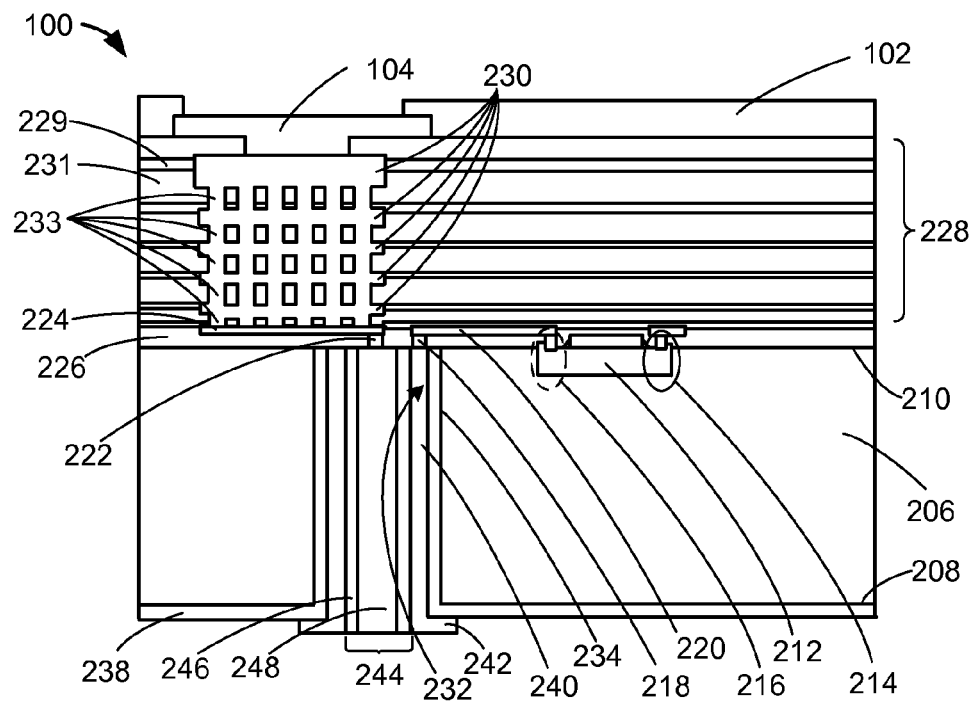
FIG. 2 is a cross-sectional view of the integrated circuit packaging system along line segment 2-2 of FIG. 1.

Referring now to FIG. 2, therein is shown a cross-sectional view of the integrated circuit packaging system 100 along line segment 2-2 of FIG. 1. The cross-sectional view depicts an integrated circuit substrate 206, such as a silicon substrate, gallium arsenide substrate, or an indium phosphate substrate, having a non-active side 208 and an active side 210 with active circuitry (not shown) fabricated thereto.

A device 212, such as a transistor or a circuit network, can be formed along the active side 210. The device 212 can have a source 214, as depicted by the solid oval, and a drain 216, as depicted by the dashed oval. The designation of the source 214 and the drain 216 for the device 212 is shown as an example. The regions depicted as the source 214 and the drain 216 can function as a drain and as a source, respectively, depending on the overall circuitry of the active side 210.

A first contact 218, such as a tungsten plug or a copper contact, can be along the active side 210. A first interconnect 220, such as an interconnect of a first metal layer, can be connected between the first contact 218 and the device 212.

For illustrative purposes, the integrated circuit packaging system 100 is shown with the first interconnect 220 connecting the first contact 218 with the drain 216 of the device 212, although it is understood that the first interconnect 220 can connect the first contact 218 with a different part of the device 212. For example, the first interconnect 220 can connect the first contact 218 with the source 214 of the device 212.

A second contact 222, such as a tungsten plug or a copper contact, can be along the active side 210. A second interconnect 224, such as an interconnect of the first metal layer, can be connected to the second contact 222.

An insulation layer 226, such as a high density plasma oxide, can be over the active side 210 and can cover a portion of the device 212. The first contact 218 and the second contact 222 can be through the insulation layer 226. A post-passivation build-up 228, such as a back end of line (BEOL) stack, can be over the insulation layer 226. The post-passivation build-up 228 can be between the active side 210 and the encapsulation 102.

The post-passivation build-up 228 can include diffusion barrier layers 229. The diffusion barrier layers that can also function as an etch stop layer. The post-passivation build-up 228 can include alternating stacks of conductive liners 230, such as a metal layer including copper, tungsten, aluminum, silver, gold, other metals, or alloys thereof, and stack insulators 231, such as an oxide, an organo-silicate glass, organic or inorganic, low-k dielectric constant material (k<4), ultra low-k dielectric constant material (k<2.5), or any other suitable dielectric materials, over the insulation layer 226. The same or different insulator materials may be used to form the insulation layers 226 and stack insulators 231.

The conductive liners 230 can be electrically connected by one or more connecting vias 233. The connecting vias 233, such as a conductor including copper, tungsten, aluminum, silver, gold, other metals, or alloys thereof, can be formed in the stack insulators 231, positioned between each respective pair of conductive liners 230, and filled with metal. For example, the same or different metals may be used for the conductive liners 230 and the connecting vias 233. As a further example, copper is used in one embodiment because of its low resistance.

The encapsulation 102 can be over the post-passivation build-up 228. The mounting pads 104 can be exposed from the encapsulation 102. The encapsulation 102 can be formed as part of a process forming the post-passivation build-up 228.

For illustrative purposes, the integrated circuit packaging system 100 is shown with the second interconnect 224 attached to the connecting vias 233, although it is understood that the second interconnect 224 can be attached differently. For example, the second interconnect 224 can be attached to the mounting pads 104 through the post-passivation build-up 228.

The integrated circuit substrate 206 can have a recess 232 from the non-active side 208. The recess 232 can have a side wall 234 that can be perpendicular to the non-active side 208. The recess 232 can traverse between the active side 210 and the non-active side 208. As another example, the recess 232 can traverse between the non-active side 208 and the encapsulation 102.

For illustrative purposes, the integrated circuit packaging system 100 is shown having the recess 232 in a perpendicular configuration to the non-active side 208, although it is understood that the integrated circuit packaging system 100 can have the recess 232 in a different configuration. For example, the recess 232 can be in an obtuse angle relative to the non-active side 208.

An isolation liner 238, such an oxide coating or a dielectric liner, can be over the non-active side 208 and along the side wall 234 of the recess 232. The portion of the isolation liner 238 over the side wall 234 can traverse between the active side 210 and the non-active side 208. As another example, the isolation liner 238 can traverse between the non-active side 208 and the encapsulation 102 and can be exposed from the encapsulation 102.

A first via 240, such as a conductor including tungsten, copper, other metals, or metallic alloys, can be within the recess 232. The isolation liner 238 can minimize or eliminate current flow to and from the integrated circuit substrate 206 and the first via 240. The first via 240 can be over the portion of the isolation liner 238 within the recess 232.

The first via 240 can be exposed beyond the non-active side 208 and the isolation liner 238. The first via 240 can have a first via extension 242 over the portion of the isolation liner 238 that is over the non-active side 208.

The first via 240 can have an opening 244 from the non-active side 208. The first via 240 and having the opening 244 can traverse between the active side 210 and the non-active side 208. As another example, the first via 240 having the opening 244 can traverse between the non-active side 208 and the encapsulation 102 and can be exposed from the encapsulation 102. The first via 240 can be connected to the first contact 218. The first via 240 can be grounded.

A barrier liner 246, such as an oxide coating or a dielectric liner, can be within the opening 244 and along the first via 240. The barrier liner 246 can traverse between the active side 210 and the non-active side 208. As another example, the barrier liner 246 can traverse between the non-active side 208 and the encapsulation 102 and can be exposed from the encapsulation 102. The barrier liner 246 can be exposed beyond the non-active side 208 and the isolation liner 238. The portion of the barrier liner 246 exposed beyond the non-active side 208 and the isolation liner 238 can be planar with the first via extension 242 of the first via 240.

A second via 248, such as a conductor including tungsten, copper, other metals, or metallic alloys, can be over the barrier liner 246 and within the opening 244 of the first via 240. The second via 248 can traverse between the active side 210 and the non-active side 208. As another example, the second via 248 can traverse between the non-active side 208 and the encapsulation 102 and can be exposed from the encapsulation 102. The second via 248 can be exposed beyond the non-active side 208 and the isolation liner 238.

The portion of the second via 248 exposed beyond the non-active side 208 and the isolation liner 238 can be planar with the first via extension 242 of the first via 240. The portion of the second via 248 exposed beyond the non-active side 208 and the isolation liner 238 can be planar with the portion of the barrier liner 246 exposed beyond the non-active side 208 and the isolation liner 238. The second via 248 can be connected to the second contact 222. The second via 248 can be connected to signal path (not shown) or a power source (not shown). The first via 240 connected to ground can function as an electromagnetic interference (EMI) shield for the second via 248.

The first via 240 and the second via 248 can also be differentially connected. The first via 240 can be connected to one signal of a differential pair (not shown). The second via 248 can be connected to the other signal of the differential pair.

For illustrative purposes, the integrated circuit packaging system 100 is shown with the first via 240 and the second via 248 adjacent to the device 212, although it is understood that the integrated circuit packaging system 100 can have a different configuration with the first via 240 and the second via 248 with the device 212. For example, the first via 240 can attach directly to the source 214 or the drain 216. The source 214 and the drain 216 can be enlarged to allow reliable connectivity with the first via 240.

It has been discovered that the present invention provides an integrated circuit packaging system for improved reliability with connect to the next system level (not shown in this figure). The extensions of the first via and the second via beyond the isolation liner allows for robust connection from the non-active side to the next system level. The barrier liner extending beyond the isolation liner also provides a continuous shielding structure to the next system level.

It has been also discovered that the present invention provides an integrated circuit packaging system for improved high frequency and lower power. The first via and the second via can be differentially connected for improved matching of differential signals. This improved matching can allow for increased frequency of the differential pair. The improved matching can also allow lower power consumption for a specific frequency without pushing the performance limits.

It has been further discovered that the present invention provides an integrated circuit packaging system for improved signal integrity. The first via, the second via, or a combination thereof can connect directly to the source or drain of the device. This eliminates discontinuities that exist by connecting the source or drain to the metal layer and from the metal layer to the first via or the second via. This elimination of the discontinuities improves the signal integrity carried in the first via or the second via.

It has been found that the present invention provides an integrated circuit packaging system for improved high performance and improved high frequency, with a multi-layered via structure. The first via, connected to ground, can function as an EMI shield for the power or signal carried in the second via. The shielding allows for increased frequency and performance without affecting the integrated circuit substrate, the device, or other multi-layered via structure.

Figure 3A:
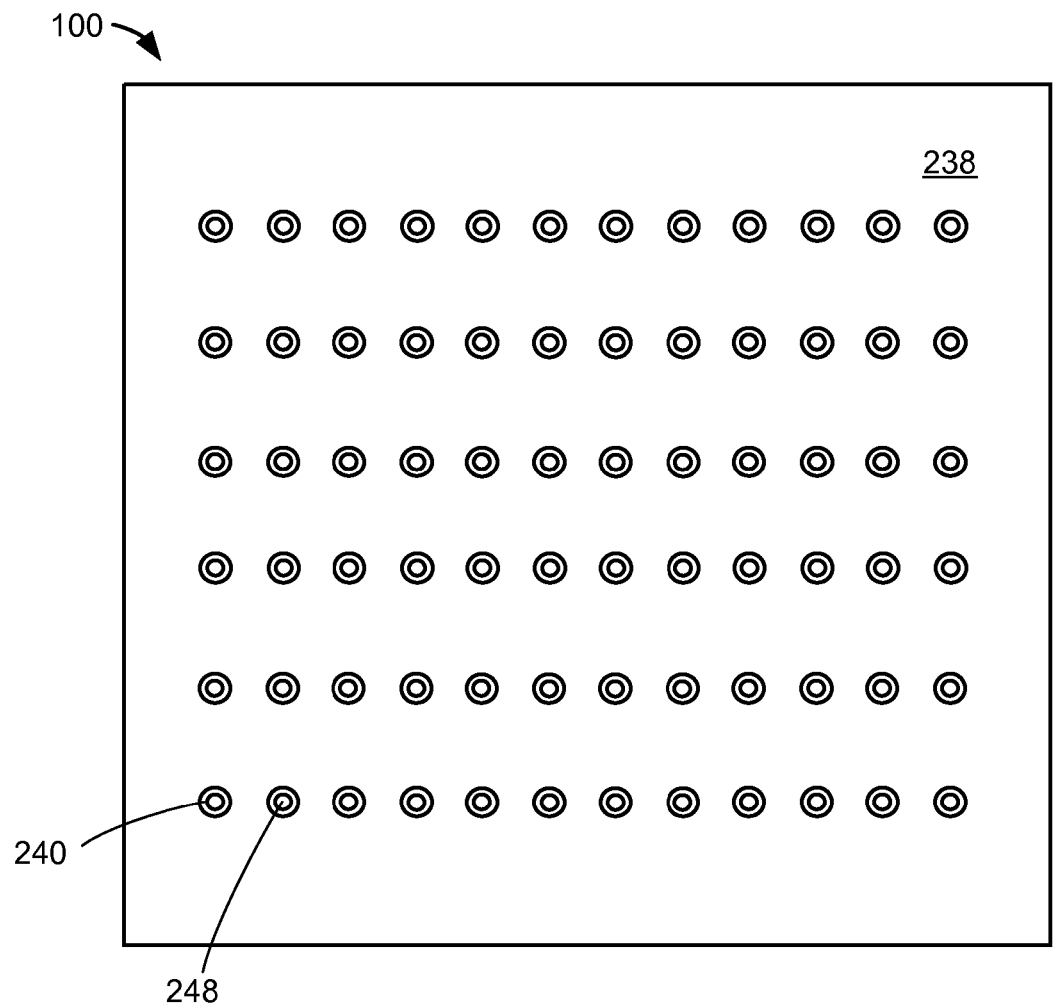
FIG. 3A is a bottom view of the integrated circuit packaging system of FIG. 1.

Referring now to FIG. 3A, therein is shown a bottom view of the integrated circuit packaging system 100 of FIG. 1. The bottom view depicts the isolation liner 238. The first via 240 and the second via 248 can be exposed from beyond the isolation liner 238.

For illustrative purposes, the first via 240 and the second via 248 are arranged in an array configuration, although it is understood that the first via 240 and the second via 248 can have a different configuration. For example, the first via 240 and the second via 248 can be arranged in a staggered configuration.

Figure 3B:
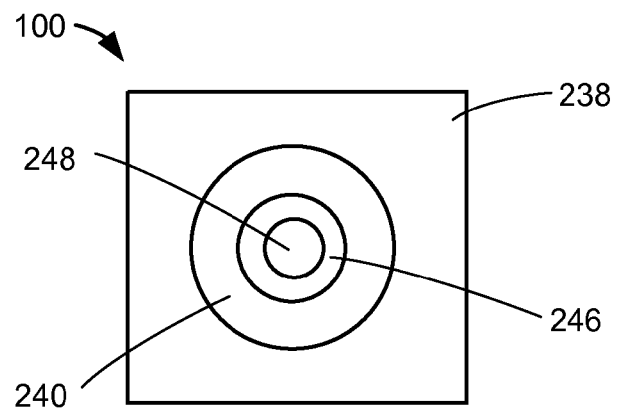
FIG. 3B is a detailed bottom view of the integrated circuit packaging system of FIG. 1.

Referring now to FIG. 3B, therein is shown a detailed bottom view of the integrated circuit packaging system 100 of FIG. 1. The detailed bottom view depicts the first via 240, the barrier liner 246, and the second via 248. The second via 248 can be concentric with the barrier liner 246 and the barrier liner 246 can be concentric with the first via 240.

For illustrative purposes, the integrated circuit packaging system 100 is shown with the first via 240 concentric with the second via 248 and the barrier liner 246, although it is understood that the integrated circuit packaging system 100 can have a different configuration with the first via 240, the second via 248, and the barrier liner 246. For example, all the vias of the integrated circuit packaging system 100 may not have both the first via 240 and the second via 248. Also, the multi-layered via can have more than the first via 240 and the second via 248, such as having other vias within or encompassing the first via 240 and the second via 248.

Also for illustrative purposes, the first via 240, the barrier liner 246, and the second via 248 are shown having a circular shape, although it is understood that the first via 240, the barrier liner 246, and the second via 248 can have a different shape. For example, the first via 240, the barrier liner 246, and the second via 248 can have a square or rectangular shape.

Figure 4:
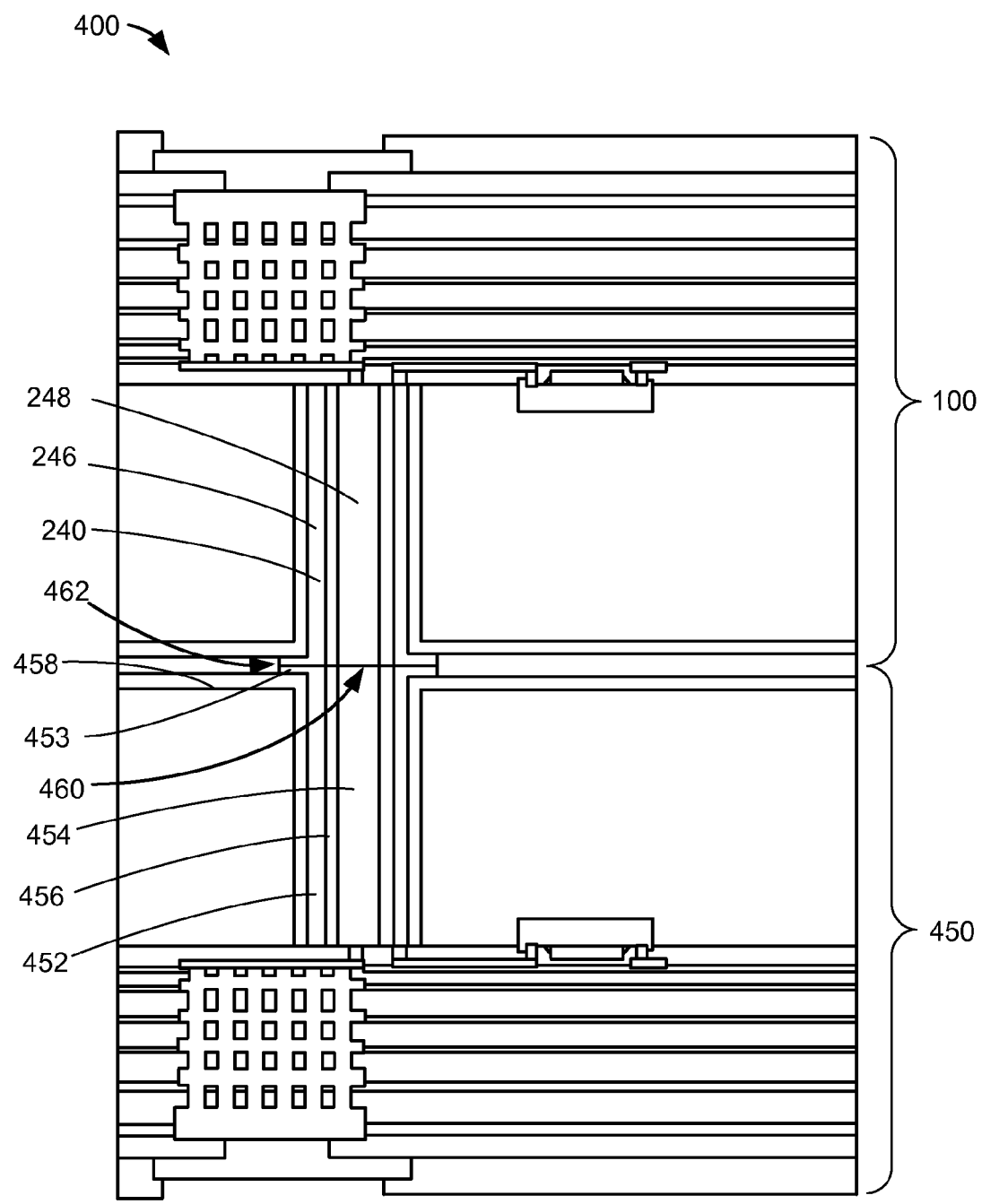
FIG. 4 is shown a cross-sectional view of an integrated package-on-package system with the integrated circuit packaging system of FIG. 1 in a second embodiment of the present invention.

Referring now to FIG. 4, therein is shown a cross-sectional view of an integrated package-on-package system 400 with the integrated circuit packaging system 100 of FIG. 1 in a second embodiment of the present invention. The cross-sectional view depicts the integrated circuit packaging system 100 mounted over a stacking device 450, such as an integrated circuit or a packaged integrated circuit. The stacking device 450 can be another instance of the integrated circuit packaging system 100 or a similar structure to the integrated circuit packaging system 100.

The stacking device 450 can have a third via 452, a fourth via 454, and a separation liner 456 exposed from beyond a top side 458 of the stacking device 450. The third via 452 can have a third via extension 453 over the top side 458. The separation liner 456 can be between the third via 452 and the fourth via 454.

A concentric inter-device interconnect 460 can be formed between the integrated circuit packaging system 100 and the stacking device 450. A concentric inter-device contact 462 can be formed by attaching the first via 240 and the third via 452, the barrier liner 246 to the separation liner 456, the second via 248 to the fourth via 454, and the first via extension 242 and the third via extension 453. For example, the concentric inter-device contact 462 can be established by a metal-to-metal bonding technique, such as a thermo-compression process where the first via 240 can be bonded to the third via 452 and the second via 248 can be bonded to the forth via 454. The barrier liner 246 can be aligned over the separation liner 456 to isolate the attachment of the first via 240 and the third via 452 from the attachment of the second via 248 and the fourth via 454.

It has yet further discovered that the present invention provides an integrated circuit package-on-package system having increased input/output (I/O) density. The increased I/O density of the integrated circuit packaging system is achieved with the area needed for the first via extension, the third via extension, and the concentric inter-device contact. This allows for the concentric inter-device contact to be closer together.

Figure 5:
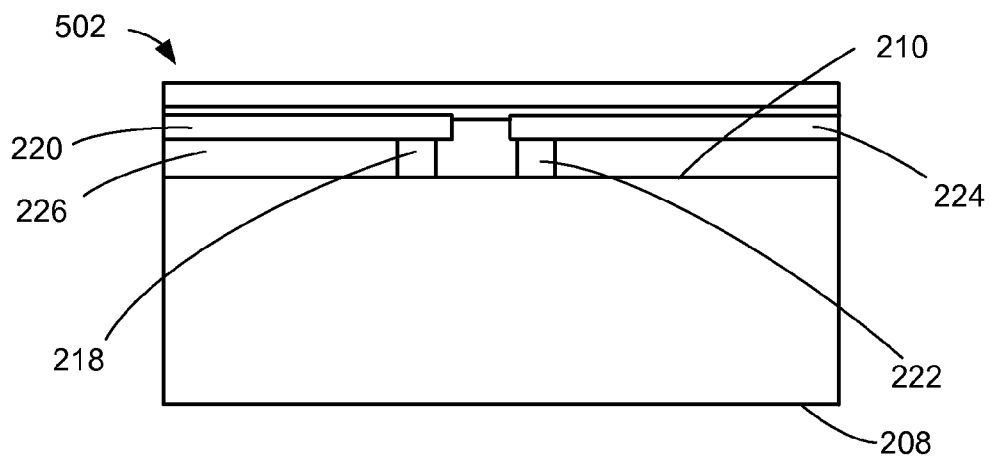
FIG. 5 is a cross-sectional view of a portion of a wafer.

Referring now to FIG. 5, therein is shown a cross-sectional view of a portion of a wafer 502. The wafer 502 can have the non-active side 208 and the active side 210 with active circuitry, such as the device 212 of FIG. 2, fabricated thereto. The first contact 218 can be along the active side 210. The first interconnect 220 can be connected to the first contact 218. The second contact 222 can be along the active side 210. The second interconnect 224 can be connected to the second contact 222. The insulation layer 226 can be over the active side 210. The first contact 218 and the second contact 222 can be through the insulation layer 226.

Figure 6:
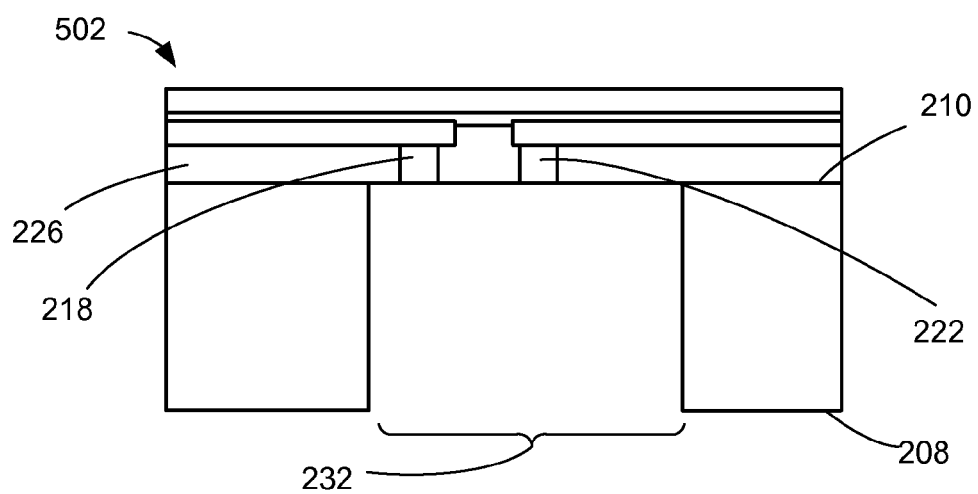
FIG. 6 is the structure of FIG. 5 in forming the recess in the wafer.

Referring now to FIG. 6, therein is shown the structure of FIG. 5 in forming the recess 232 in the wafer 502. The recess 232 can be formed from the non-active side 208 to the active side 210. The recess 232 can expose a portion of the insulation layer 226, the first contact 218 and the second contact 222. The recess 232 can be formed in a number of different ways. For example, the recess 232 can be formed by methods such as chemical etching or laser cutting. Forming the recess 232 does not disturb the active circuitry.

Figure 7:
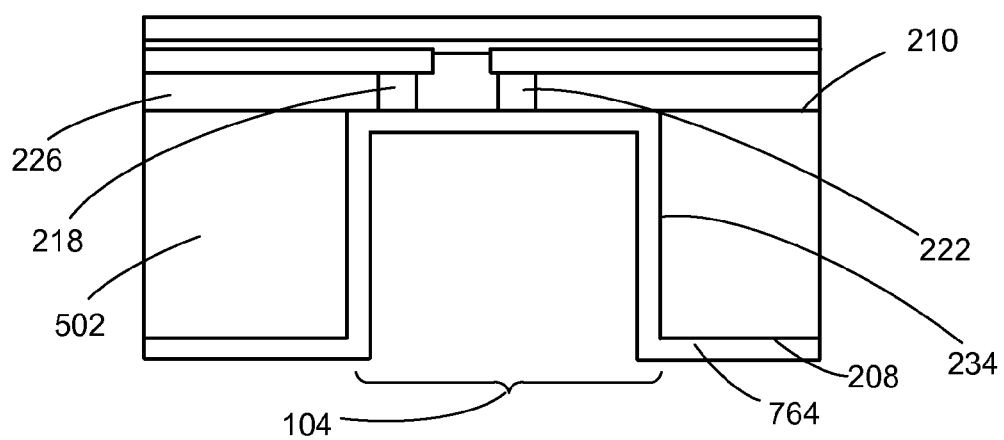
FIG. 7 is the structure of FIG. 6 in forming an isolation layer.

Referring now to FIG. 7, therein is shown the structure of FIG. 6 in forming an isolation layer 764. The isolation layer 764 can be formed over the non-active side 208 and along the side wall 234 of the recess 232. The isolation layer 764 can cover the insulation layer 226, the first contact 218, and the second contact 222 exposed in the recess 232. The isolation layer 764 can be formed in a number of ways. For example, the isolation layer 764 can be formed by deposition techniques, such as chemical vapor deposition or physical vapor deposition.

Figure 8:
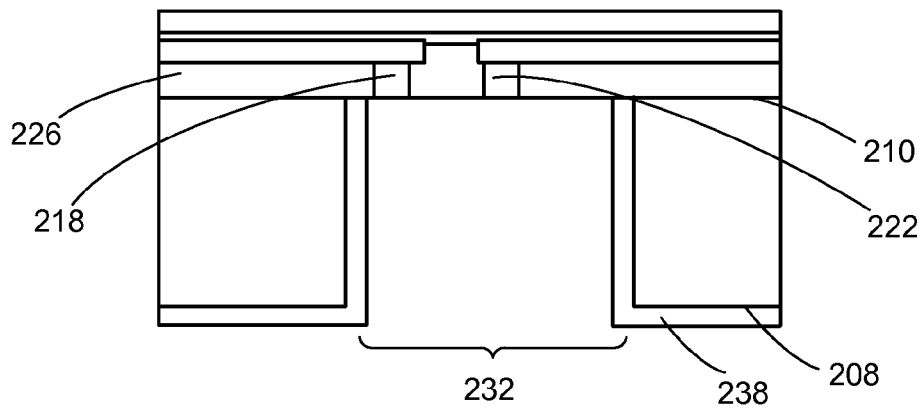
FIG. 8 is the structure of FIG. 7 in forming the isolation lining.

Referring now to FIG. 8, therein is shown the structure of FIG. 7 in forming the isolation liner 238. Forming the isolation liner 238 can expose the insulation layer 226, the first contact 218, and the second contact 222 within the recess 232. The isolation liner 238 can be formed in a number of different ways.

For example, the isolation liner 238 can be formed from the isolation layer 764 of FIG. 7 by removing the portion of the isolation layer 764 of FIG. 7 within the recess 232 covering the insulation layer 226, the first contact 218 and the second contact 222. The isolation liner 238 can be formed by methods such as chemical etching or laser etching.

Figure 9:
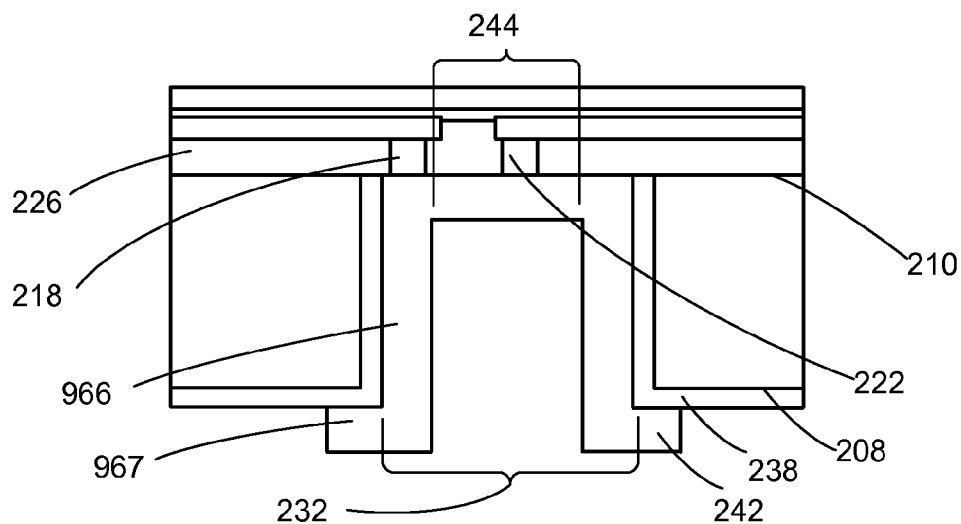
FIG. 9 is the structure of FIG. 8 in forming a via structure.

Referring now to FIG. 9, therein is shown the structure of FIG. 8 in forming a via structure 966. The via structure 966 can be formed within the recess 232 over the isolation liner 238. The via structure 966 can traverse between the active side 210 and the non-active side 208.

The via structure 966 can cover the insulation layer 226, the first contact 218, and the second contact 222. The via structure 966 can have a via structure extension 967 over a portion of the isolation liner 238 that is over the non-active side 208. The via structure 966 can have the opening 244 from the non-active side 208.

The via structure 966 can be formed in a number of different ways. For example, the via structure 966 can be formed by masking and metal deposition techniques, such as sputtering, chemical vapor deposition or physical vapor deposition.

Figure 10:
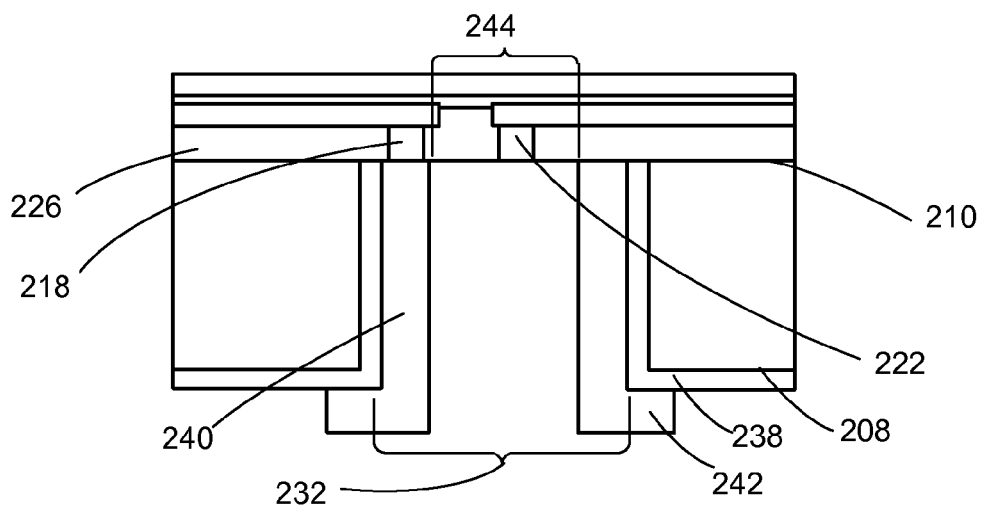
FIG. 10 is the structure of FIG. 9 in forming the first via.

Referring now to FIG. 10, therein is shown the structure of FIG. 9 in forming the first via 240. Forming the first via 240 can expose the portion of the insulation layer 226 and the second contact 222 within the opening 244 of the first via 240. Forming the first via 240 can include connecting the first via 240 and the first contact 218. Forming the first via 240 can include forming the first via extension 242.

The first via 240 can be formed in a number of different ways. For example, the first via 240 can be formed from the via structure 966 of FIG. 9 by removing the portion of the via structure 966 of FIG. 9 within the opening 244 covering the insulation layer 226 and the second contact 222. The first via 240 can be formed by methods such as chemical etching or laser etching.

Figure 11:
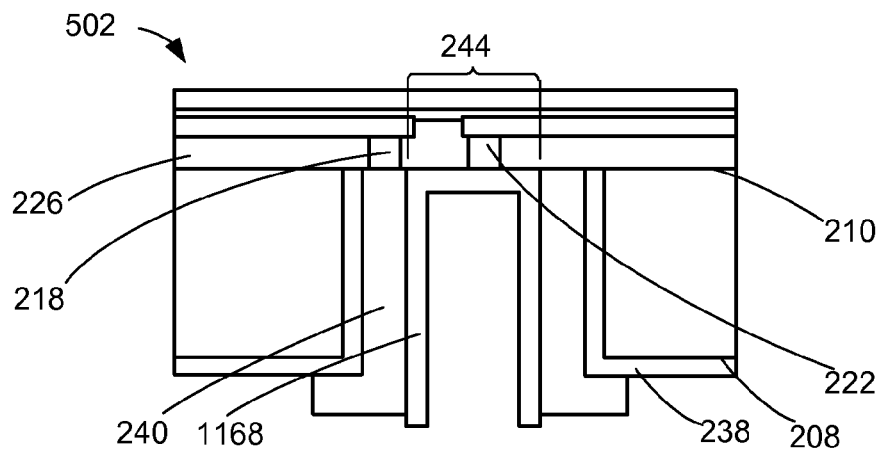
FIG. 11 is the structure of FIG. 10 in forming a barrier layer.

Referring now to FIG. 11, therein is shown the structure of FIG. 10 in forming a barrier layer 1168. The barrier layer 1168 can be formed within the opening 244 of the first via 240. The barrier layer 1168 can also be formed over the portion of the insulation layer 226 and the second contact 222 exposed within the opening 244 of the first via 240. The barrier layer 1168 can traverse between the active side 210 and the non-active side 208 of the wafer 502. The barrier layer 1168 can be exposed from beyond the non-active side 208.

The barrier layer 1168 can be formed in a number of different ways. For example, the barrier layer 1168 can be formed by mask and deposition techniques, such as chemical vapor deposition or physical vapor deposition.

Figure 12:
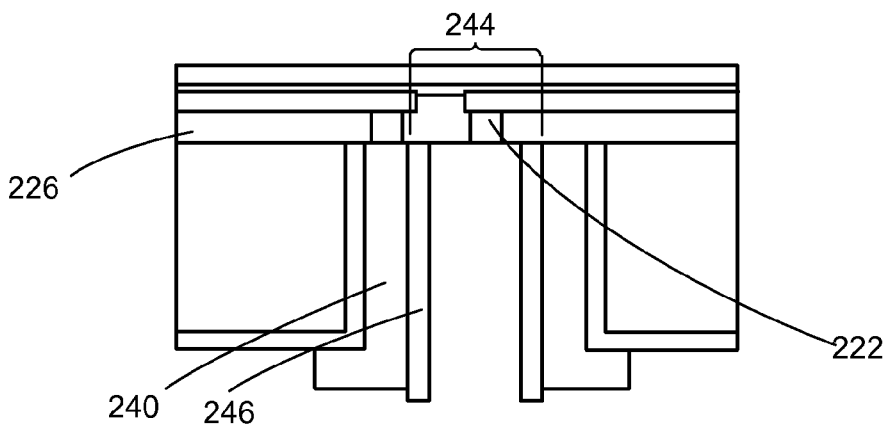
FIG. 12 is the structure of FIG. 11 in forming the barrier liner.

Referring now to FIG. 12, therein is shown the structure of FIG. 11 in forming the barrier liner 246. Forming the barrier liner 246 can expose the portion of the insulation layer 226 and the second contact 222 within the opening 244 of the first via 240. The barrier liner 246 can be formed in a number of different ways.

For example, the barrier liner 246 can be formed from the barrier layer 1168 of FIG. 11 by removing the portion of the barrier layer 1168 of FIG. 11 within the opening 244 of the first via 240 covering the insulation layer 226 and the second contact 222. The barrier liner 246 can be formed by methods such as chemical etching or laser etching.

Figure 13:
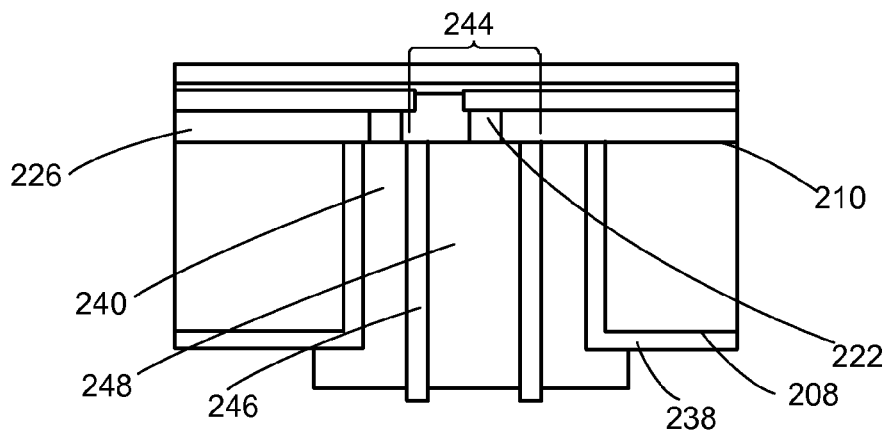
FIG. 13 is the structure of FIG. 12 in forming the second via.

Referring now to FIG. 13, therein is shown the structure of FIG. 12 in forming the second via 248. The second via 248 can be formed over the portion of the barrier liner 246 within the opening 244 of the first via 240. The second via 248 can cover the portion of the insulation layer 226 and the second contact 222 exposed within the opening 244 of the first via 240. The second via 248 can be connected to the second contact 222. The second via 248 can traverse between the active side 210 and the non-active side 208. The second via 248 can be exposed beyond the non-active side 208 and the isolation liner 238.

The second via 248 can be formed in a number of different ways. For example, the second via 248 can be formed by masking and metal deposition techniques, such as sputtering, chemical vapor deposition or physical vapor deposition.

Figure 14:
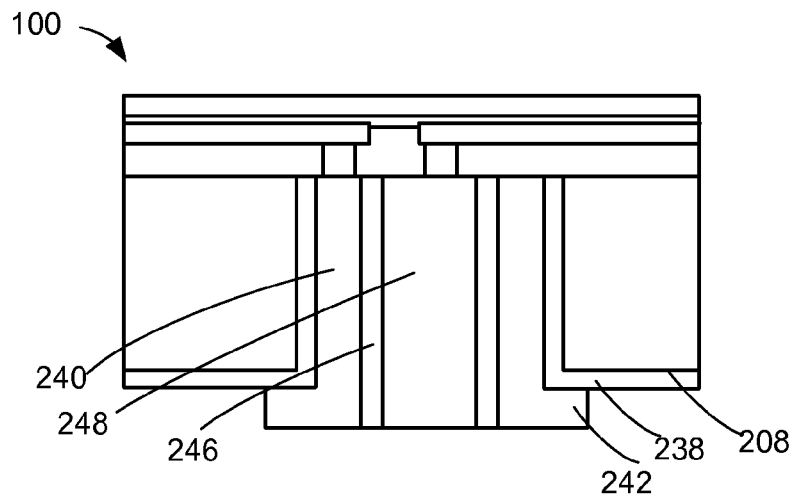
FIG. 14 is the structure of FIG. 13 in forming the integrated circuit packaging system of FIG. 1.

Referring now to FIG. 14, therein is shown the structure of FIG. 13 in forming the integrated circuit packaging system 100 of FIG. 1. The integrated circuit packaging system 100 can be formed by singulating the wafer 502 of FIG. 13. The portion of the first via extension 242 of the first via 240 facing away from the non-active side 208 can be planarized with the portion of the barrier liner 246 and the second via 248 exposed beyond the non-active side 208. The isolation liner 238, the first via 240, the barrier liner 246 and the second via 248 can be formed by via last processing.

Figure 15:
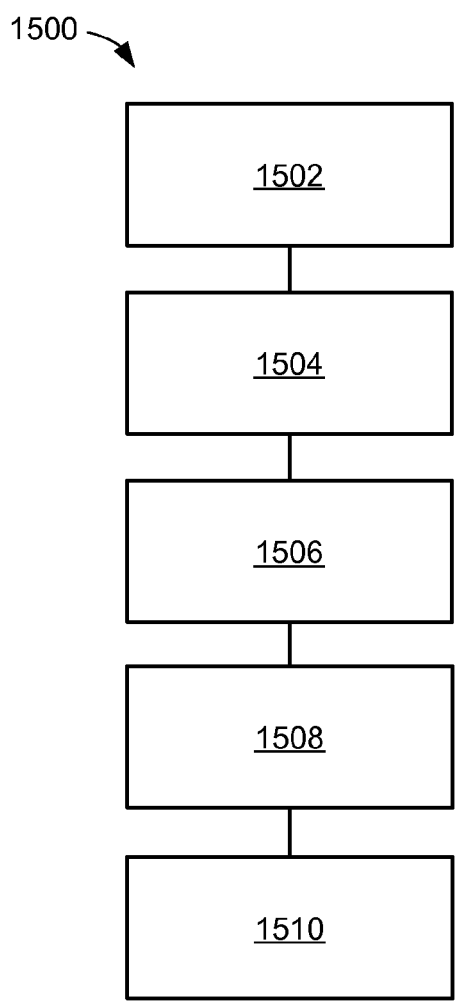
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes providing an integrated circuit substrate having a non-active side and an active side in a block 1502; forming a recess in the integrated circuit substrate from the non-active side exposing a first contact and a second contact with the first contact and the second contact along the active side in a block 1504; forming a first via, having a first via extension extended beyond the non-active side and an opening at the non-active side, within the recess in a block 1506; forming a barrier liner within the opening with the barrier liner exposed beyond the non-active side in a block 1508; and forming a second via over the barrier liner and within the opening of the first via with the second via exposed beyond the non-active side in a block 1510.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing an integrated circuit substrate having a non-active side and an active side;
   forming a recess in the integrated circuit substrate from the non-active side exposing a first contact and a second contact with the first contact and the second contact along the active side;
   forming a first via, having a first via extension extended beyond the non-active side and an opening at the non-active side, within the recess;
   forming a barrier liner within the opening with the barrier liner exposed beyond the non-active side; and
   forming a second via over the barrier liner and within the opening of the first via with the second via exposed beyond the non-active side.

2. The method as claimed in claim 1 wherein:
   providing the integrated circuit substrate includes providing a device, having a source and a drain, along the active side; and
   connecting the first via directly to the source or the drain.

3. The method as claimed in claim 1 further comprising forming an isolation liner over the non-active side and within the recess with the isolation liner between the first via and the integrated circuit substrate, and with the barrier liner and the second via exposed beyond the isolation liner.

4. The method as claimed in claim 1 wherein:
   forming the first via includes connecting the first via and the first contact; and
   forming the second via includes connecting the second via and the second contact.

5. The method as claimed in claim 1 further comprising:
   providing a stacking device having a third via, a fourth via, and a separation liner between the third via and the fourth via with the third via having a third via extension; and
   forming a concentric inter-device interconnect with the barrier liner attached to the separation liner, the first via attached to the third via, and the second via attached to the fourth via.

6. A method of manufacture of an integrated circuit packaging system comprising:
   providing a integrated circuit substrate having a non-active side and an active side with a device;
   forming a recess in the integrated circuit substrate from the non-active side exposing a first contact and a second contact with the first contact and the second contact along the active side;
   forming an isolation liner over the non-active side and within the recess;
   forming a first via, having a first via extension extended beyond the non-active side and an opening at the non-active side, over the isolation liner and in the recess;
   forming a barrier liner within the opening with the isolation liner exposed beyond the non-active side;
   forming a second via over the barrier liner and within the opening of the first via with the second via exposed beyond the non-active side; and
   connecting the first via to the device.

7. The method as claimed in claim 6 further comprising differentially connecting the first via and the second via.

8. The method as claimed in claim 6 wherein:
   forming the second via includes forming the second via concentric with the barrier liner; and
   forming the barrier liner includes forming the barrier liner concentric with the first via.

9. The method as claimed in claim 6 further comprising grounding the first via.

10. The method as claimed in claim 6 further comprising:
forming an encapsulation over the active side; and wherein:
forming the recess includes forming the recess traversing between the encapsulation and the non-active side;
forming the first via includes forming the first via traversing between the encapsulation and the non-active side with the first via exposed from the encapsulation;
forming the barrier liner includes forming the barrier liner traversing between the active side and the non-active side with the barrier liner exposed from the encapsulation; and
forming the second via includes forming the second via traversing between the encapsulation and the non-active side with the second via exposed beyond the encapsulation.

11. An integrated circuit packaging system comprising:
an integrated circuit substrate having a non-active side, an active side and a recess from the non-active side;
a first contact along the active side and within the recess;
a second contact along the active side and within the recess;
a first via, having a first via extension extended beyond the non-active side and an opening at the non-active side, within the recess;
a barrier liner within the opening with the barrier liner exposed beyond the non-active side; and
a second via over the barrier liner and within the opening of the first via with the second via exposed beyond the non-active side.

12. The system as claimed in claim 11 wherein:
the integrated circuit substrate includes a device, having a source and a drain, along the active side of the integrated circuit substrate; and
the first via is connected to the source or the drain.

13. The system as claimed in claim 11 further comprising an isolation liner over the non-active side and within the recess with the isolation liner between the first via and the integrated circuit substrate.

14. The system as claimed in claim 11 wherein:
the first via is connected to the first contact; and
the second via is connected to the second contact.

15. The system as claimed in claim 11 further comprising:
a stacking device having a third via, a fourth via, and a separation liner between the third via and the fourth via with the third via having a third via extension; and
a concentric inter-device interconnect including:
the barrier liner attached to the separation liner,
the first via attached to the third via, and
the second via attached to the fourth via.

16. The system as claimed in claim 11 further comprising:
an isolation liner over the non-active side and within the recess; wherein:
the integrated circuit substrate includes a device; and
the first via is over the isolation liner and connected to the device.

17. The system as claimed in claim 16 wherein the first via and the second via is differentially connected.

18. The system as claimed in claim 16 wherein:
the second via is concentric with the barrier liner; and
the barrier liner is concentric with the first via.

19. The system as claimed in claim 16 wherein the first via is grounded.

20. The system as claimed in claim 16 further comprising:
an encapsulation over the active side; and wherein:
the recess traverses between the encapsulation and the non-active side;
the first via traverses between the encapsulation and the non-active side with the first via exposed from the encapsulation;
the barrier liner traverses between the active side and the non-active side with the barrier liner exposed from the encapsulation; and
the second via traverses between the encapsulation and the non-active side with the second via exposed beyond the encapsulation.

* * * * *